United States Patent [19]
Camire

[11] Patent Number: 5,793,874
[45] Date of Patent: Aug. 11, 1998

[54] CONTROL CIRCUIT

[75] Inventor: Arthur J. Camire, Calumet City, Ill.

[73] Assignee: New Product Development, Inc., Orland Park, Ill.

[21] Appl. No.: 431,086

[22] Filed: Apr. 28, 1995

[51] Int. Cl.[6] .................... H03G 11/06; H03G 3/20
[52] U.S. Cl. .................. 381/57; 381/55; 381/104
[58] Field of Search ...................... 381/57, 103, 104, 381/107, 96, 59, 195, 102, 119, 109, 55

[56] References Cited

U.S. PATENT DOCUMENTS

| | | | |
|---|---|---|---|
| 3,133,990 | 5/1964 | Seeley | 381/57 |
| 4,254,303 | 3/1981 | Takizawa | 381/107 |
| 4,340,780 | 7/1982 | Odlen | 381/103 |
| 4,628,526 | 12/1986 | Germer | 381/57 |
| 5,509,081 | 4/1996 | Kuusama | 381/57 |
| 5,615,256 | 3/1997 | Yamashita | 381/57 |

*Primary Examiner*—Curtis Kuntz
*Assistant Examiner*—Xu Mei
*Attorney, Agent, or Firm*—Varnum, Riddering, Schmidt & Howlett LLP

[57] ABSTRACT

A volume control device is inserted in the circuit between the output of a sound system amplifier and a speaker. The volume control device measures ambient noise in the music environment and adjusts the power transferred to the speaker, such that the output volume of the speaker increases and decreases with changes in the ambient noise. A variable throughput current device, such as a thermistor or a transistor, is connected in the speaker circuit to control a power transfer to the speaker. A comparator compares the output of an ambient noise detector with the signal applied to the speaker and the variable throughput current device is adjusted in accordance with the compared signals. A level detect circuit serves to maintain the speaker volume at a preset level when the amplifier output drops below a predefined signal level. The speaker may be provided with a sensing coil generating an output signal representative of the level of ambient noise in the vicinity of the speaker.

14 Claims, 2 Drawing Sheets

CONTROL CIRCUIT

BACKGROUND OF THE INVENTION

1. Field of the Invention

The invention pertains to the control of speaker output of a sound system and more particularly pertains to circuitry for controlling the output of a speaker in response to changes in ambient noise level.

2. Background Art

Sound systems are commonly used to provide pleasant background music in restaurants and other gathering places. Typically, the music is supplied from an amplifier system connectable to a number of different sources, such as a broadcast radio, tape deck, compact disk players, etc. The ambient noise level in the area where the music is broadcast tends to change from time to time, particularly in eating establishments and the like. The music level is preferably adjusted to a volume level such that it is distinguishable above the ambient noise but not so loud that it becomes annoying.

Automatic music level adjusting arrangements are know which employ a microphone to detect ambient noise level and adjust the amplifier output accordingly. Commercial sound systems are commonly relatively expensive and the amplifier units are normally in a factory sealed case. If a separate input for an ambient noise detector is not provided on an amplifier, wiring connections must be made to specific electrical nodes internal to the circuit. This typically requires the services of skilled technicians. Such units are therefore expensive to retrofit. It is an object of the present invention to provide an efficient and cost-effective system for controlling audio output in an environment with varying ambient noise levels.

SUMMARY OF INVENTION

These and other problems of the prior art are overcome in accordance with this invention by means of a volume control including a variable current throughput device connected to the amplifier and the loudspeaker of a sound system and responsive to a volume control signal, generated by means of control circuitry connected to an ambient sound detector, to selectively control transfer of power from the amplifier to the loudspeaker, thereby controlling audio output volume of the loudspeaker. Advantageously, the volume control of this invention is connected to the output of the amplifier and to the loudspeaker without requiring access to any internal terminals of the amplifier or any other source signal generating equipment. Thus, a noise sensitive control can be readily retrofitted into an existing system. An additional advantage of the present invention is that each loudspeaker may be individually controlled. This is particularly important in a large sound system which drives speakers in a number of different individual rooms or a number of different areas of a large room where the ambient noise levels vary substantially between locations.

In one embodiment of the invention, the loudspeaker comprises an output device, such as a speaker coil or the like, which controls audible output volume proportional to electrical current supplied to the device. A variable current throughput device is connected in parallel with the output device to selectively shunt current from the output device, thereby reducing audible output volume of the loudspeaker. In one particular embodiment, the variable current throughput device is a thermistor. In another embodiment, the variable current throughput device is a transistor.

In one embodiment of the invention, the volume control of the present invention comprises a comparator circuit which compares the output of the ambient sound detector with a signal generated by the amplifier and applied to the loudspeaker to generate a comparator output signal. The comparator output signal is employed to control the power transferred from the amplifier to the loudspeaker. The output of the comparator circuit may be connected to an integrator circuit which generates an integrator output signal representative of the comparator output signal over a period of time. A level detect circuit is provided which compares a signal generated by the amplifier with a predefined signal level and the control circuitry maintains an existing level of volume control when the amplifier output signal falls below a predefined level. Advantageously, in accordance with this feature of the invention the volume control applied between the amplifier and the speaker is maintained at an existing level if the amplifier is temporarily turned down to a very low level. This feature avoids the application of full amplifier output to the speaker when the amplifier is again returned to a high level.

In one specific embodiment of the invention, the ambient sound detector is formed in the loudspeaker by means of a detector coil placed adjacent a loudspeaker coil and the detector coil is responsive to sound reflected to the loudspeaker from an area adjacent to the loudspeaker. The detector coil output is used as a reference level for automatically controlling the transfer of power from the amplifier to the speaker.

In accordance with another embodiment of the invention, a variable current throughput device is connected in series in the current path between the amplifier and the loudspeaker and the audible output volume of the loudspeaker is controlled by controlling the flow of current from the amplifier to the loudspeaker.

BRIEF DESCRIPTION OF THE DRAWINGS

An illustrative embodiment of the invention is described below with reference to the drawing in which.

DETAILED DESCRIPTION

Figure 1:
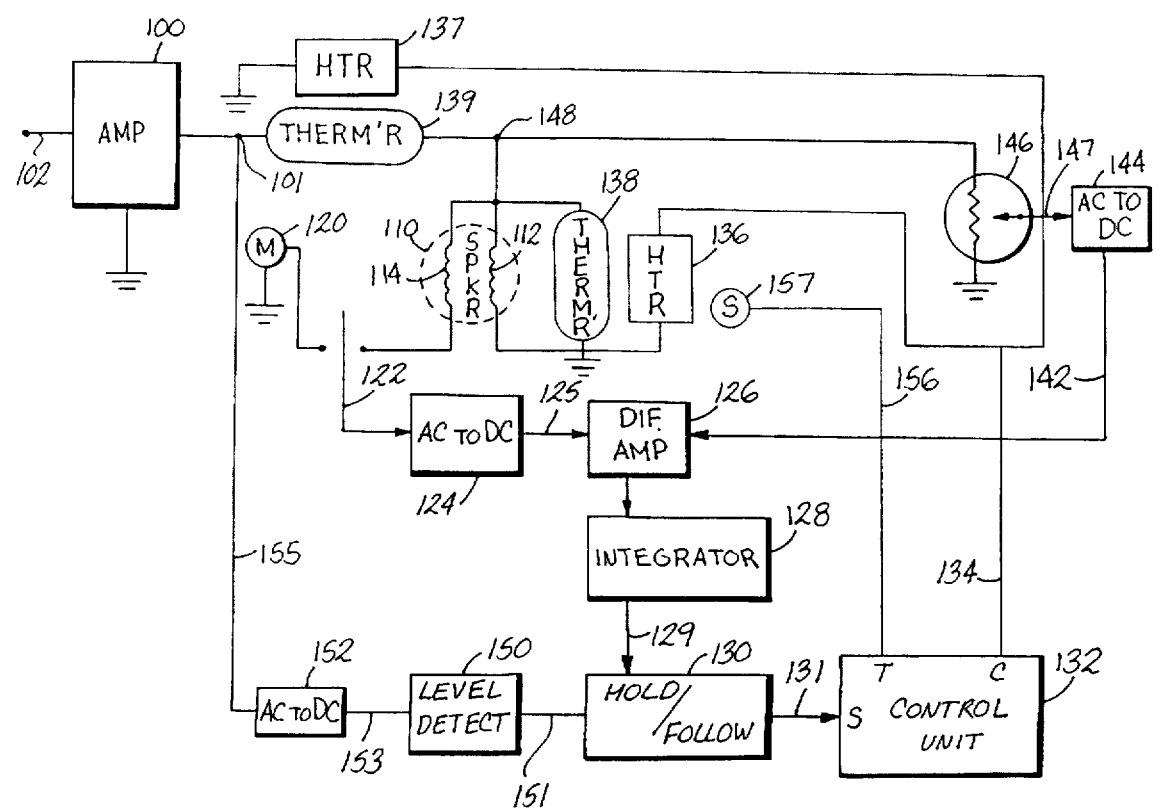
FIG. 1 is a circuit diagram representation of a volume control circuit employing thermistors to control current flow to a speaker coil.

The circuit diagram of FIG. 1 shows an amplifier 100 having an output terminal 101 and a representation of a speaker having first and second speaker coils 112 and 114. The amplifier 100 and the speaker 110 are standard parts of a sound system. A typical speaker has a single speaker coil, such as coil 112 rather than two separate coils. As is described further later here in, the speaker coil 114 may serve as an ambient noise sensing device but is not a necessary element of the invention. Not shown in the drawing is the source equipment, such as a tuner or a tape deck, etc . . . , connectable to input 102 and which provides input to the amplifier 100. FIG. 1 shows a single speaker 110. It will be understood that 110 may represent a plurality of speakers driven by the amplifier 100.

The speaker volume control arrangement of the present invention essentially comprises a control circuitry connected to the output of the amplifier 100 which selectively increases and decreases the current to the speaker coils 112, 114 in response to change in background noise in the general vicinity of the speaker. FIG. 1 shows the speaker coils 112 and 114 connected in parallel between node 148 and ground. Amplifier 100 has a power source connection (not shown in the drawing) and a ground connection. Operation of the circuit is first described with reference to coil 112. A microphone 120 is connected via a switch 122, an analog-to-digital converter 124, a differential amplifier 126, an integrator 128, a hold/follow circuit 130 to a control unit 132. The essential connection is from the microphone 120 to the control unit 132. The control unit 132, in response to a signal level change in the signal from the microphone 120 varies a control signal on conductor 134. The control signal on conductor 134 is applied to a heater 136 disposed adjacent a thermistor 138. The conductor 134 is also connected to a heater 137 adjacent a thermistor 139. The heater/thermistor combinations are operative to control the current through the speaker coil 112. Two separate thermistors 138 and 139 are used in the circuit of FIG. 1. Thermistor 138 is connected in parallel with speaker coil 112 between node 148 and ground. Thermistor 139 is connected in series with the speaker coil 112 between amplifier output terminal 101 and node 148. Either of the thermistors 138, 139 or similar current flow control devices can accomplish the function of controlling the current to the speaker coil 112, and thereby control the sound volume produced by the speaker, in response to a signal from the control unit 132. In a circuit where the thermistor 138 is used, and thermistor 139 is not used in the connection between the output 101 of the amplifier 100 and the speaker coil 112, it is desirable to insert a fixed value resister in the place of thermistor 139. The function of the fixed value resister will be to limit the output current of the amplifier in the event that the resistance of the thermistor 138, connecting in parallel with the speaker coil 112, is reduced to near 0.

The thermistor 138 is preferably of a type known as a positive thermistor, i.e. one in which the resistance is increased as heat is applied to the thermistor. The thermistor 139 is preferably of the type known as a negative thermistor, i.e. one in which the resistance decreases as the thermistor is heated. In a circuit, such as the circuit of FIG. 1 in which the two thermistors 138 and 139 are used, these units and their corresponding heating elements at 136 and 137 are selected to have the properties such that a signal of a particular amplitude on conductor 134 causes the impedance of the thermistors 138, 139 to change by approximately equal amounts but in opposite directions. In this manner, the impedance of the output load of the amplifier 100 does not change even though the current supplied to the speaker coil 112, and hence the speaker output volume, does change. The thermistors 138, 139 and their associated heater units 136, 137 are well known in the art and are commercially available devices.

The differential amplifier 126 of FIG. 1 is connected by conductor 142 to A an AC-to-DC converter 144. This device, as well as AC-to-DC converter 124 and further AC-to-DC convertor 152 connected to node 101, may be any of a number of well-known and commercially available circuits which convert an alternating electrical signal to single polarity signal, such as the converter 144 connected to a rheostat 146 which, in turn, is connected between node 148 and ground. The output of the rheostat 146 on conductor 147 provides a signal proportionally to the instantaneous voltage level at node 148. The AC-to-DC converter 144 provides an output signal to the differential amplifier 126 where that signal is compared with a signal from the AC-to-DC converter 124 on conductor 125. The signal on conductor 125 is representative of the ambient noise signal received from the microphone 120. The differential amplifier is a standard differential amplifier which provides an output signal indicative of the difference in value between the signals from the AC-to-DC converters 124 and 144. The sign of the output to the differential amplifier indicates which of the two circuits 124, 144 produces the larger magnitude signal.

An integrator circuit 128 is connected to the output of differential amplifier 126. The integrator 128 is a standard commercially available integrator circuit and provides an output which is representative of an integration of the input signal over a specified period of time. The output of the integrator 128 on conductor 129 is provided to the control unit 132 by the hold/follow circuit 130. The hold/follow circuit 130 is a commercially available device such as an LF398 or similar sample and hold chip of the National Semiconductor Company.

In addition to a signal from the integrator 128 on conductor 129, the hold and follow circuit 130 also receives an input from the level detect circuit 150 on its output conductor 151. The level detect circuit is a commercially available voltage level detector which may be adjusted to generate an output signal when the input voltage level drops below a certain value. An AC-to-DC convertor 152 is connected between output terminal 101 of amplifier 100 and the level detect circuit 150. When the signal level at terminal 101 falls below a certain level, e.g., when the volume of the amplifier 100 has been manually turned down to a low level, the signal on conductor 155 is reduced and the signal on conductor 153 to the level detect circuit 150 falls below a preset level of the level detect circuit. As a consequence, the level detect circuit generates a signal on conductor 151 to the hold/follow circuit 130 indicating that the level at output terminal 101 has fallen below the preset level. The hold/follow circuit 130 has a first operational state in which it "follows" the signal on conductor 129 and transmits a corresponding signal on conductor 131 to the control unit 132. However, when the signal on conductor 151 changes state, indicating that the amplifier output level has dropped below the predetermined limit, the circuit 130 will "hold", i.e., the output 131 will retain the signal level which was present at the time that the input signal on conductor 151 changed state and will not follow the input 129.

The level detect circuit 150, the AC-to-DC converter 152 and the hold/follow circuit 130 are provided to maintain the volume control circuitry at a predefined level when the amplifier output is drastically reduced, which typically occurs when the amplifier volume is temporarily turned down. The hold control maintains the most recent level before the change in amplifier output, thereby preventing a high volume output when the amplifier is again returned to a high output level.

The control unit 132 functions essentially as a typical heating/cooling system thermostat and a commercially available thermostat unit may be readily adapted to perform the functions of the control unit 132. The control unit 132 has a set input S connected to conductor 131 which receives a signal indicative of the temperature setting to be obtained. It has a control output C from which an output signal is transmitted on the conductor 134 to provide heating current to the thermistors 136, 137. In the circuit of FIG. 1, an increase in signal level on conductor 134 causes heaters 136, 137 to apply more heat to the thermistors. Consequently, the current through thermistor 138 is decreased and the current through thermistor 139 is increased. Accordingly, the current through the speaker coil 112 is increased, thereby increasing the output volume of the speaker.

In operation, a signal having a level proportional to the signal applied to the speaker coil 112 is provided by the rheostat 146. Accordingly, the signal on conductor 142 is indicative of the output volume of the speaker 110. This signal is compared with the signal on conductor 125 in connecting the AC-to-DC convertor 124 and the differential amplifier 126. The control unit 132, through operation of the differential amplifier 126, the integrator 128 and the hold/follow circuit 130 controls current through the heaters 136, 137 such that the two input signals to the differential amplifier 126 are essentially equal. The setting of the rheostat 146 may be controlled to define the desired difference in level between the volume output of the speaker 110 and the ambient noise detected from the microphone 120.

Figure 3:
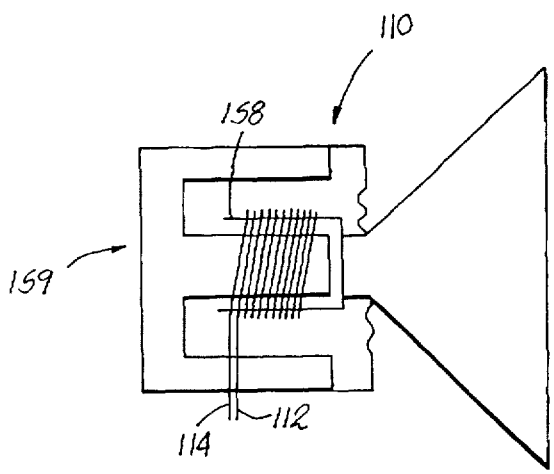
FIG. 3 is a diagrammatic representation of a loudspeaker provided with a sensing coil.

As shown in FIG. 1 and FIG. 3, the speaker 110 is provided with a second speaker coil 114 wound around the speaker core 158 in phase with the speaker coil 112, i.e., wound in the same direction as speaker coil 112. The speaker core 158 moves in a magnetic field set up by permanent magnet 159 in accordance with changes in current through coil 112. The coil 114 is connected to node 148 and, via switch 122 and AC-to-DC convertor 124, to differential amplifier 126. The signal induced in the coil 114 is indicative of movement of the speaker core as a result of the power provided through speaker coil 112 and sounds reflected back into the speaker. Since the movement of the core 158 is proportional to the electrical signal at node 148, and since coil 114 receives the same electrical signal as coil 112, it follows that the output signal from coil 114 to the switch 122 is indicative of the difference between the energy supplied from the amplifier to coil 112 and sound energy reflected into the speaker from the surrounding area. Thus, the signal on conductor 125 applied to differential amplifier 126, when switch 122 is operated to the side of coil 114, is indicative of ambient noise in the area surrounding the speaker. When the speaker 110 is provided with the additional coil 114 there is no need for the microphone 120. The microphone 120 is required only in the event that a standard single coil speaker is used.

The control unit 132 has a temperature input T connected by means of conductor 156 to a heat sensing device 157. The heat sensing device 157 senses the temperature at the heater/thermistor combination 136, 138 and provides a corresponding signal to the control unit 132. As stated earlier, the thermistor 138 is of a type known as positive thermistor. Such thermistors are commonly used as current limiting devices. If the temperature of the device rises, the device becomes essentially an open circuit, thereby acting as a protective device for the amplifier. The sensor 157 provides an indication via conductor 156 to control unit 132 of the temperature at the thermistor. The control unit 132 is responsive to a signal on conductor 156 to inhibit the output signal on its output conductor 134 as long as the signal on conductor 156 remains above a predefined level. The function of inhibiting output in response to an input indicative of a temperature setting is typically included in a standard thermostat.

Figure 2:
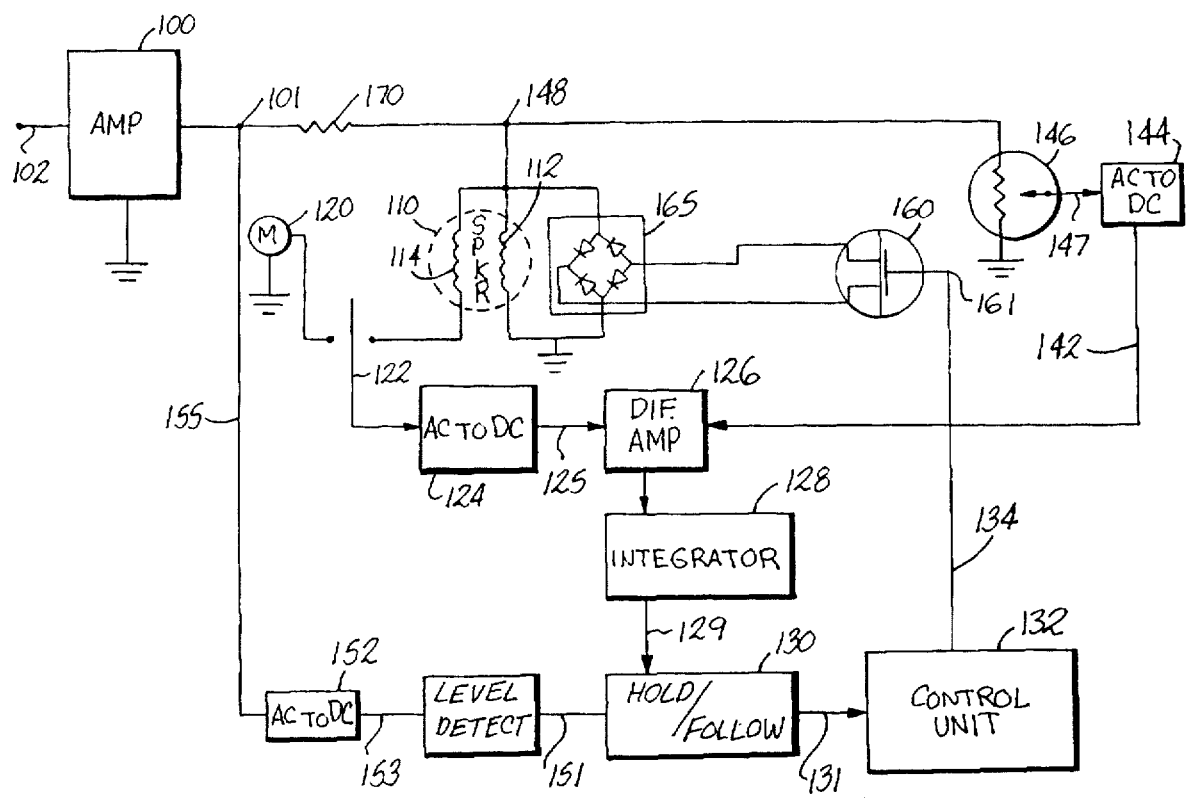
FIG. 2 is a circuit diagram representation of a volume control circuit employing a transistor to control current flow through the speaker coil.

FIG. 2 shows an alternate embodiment of the invention where, instead of thermistors, a field effect transistor (FET) is used to control the magnitude of the current reaching the speaker coil 112. The circuit of FIG. 2 employs a full wave rectifier 165 which provides a unipolarity signal to the terminals of an NFET MOS gate 160. The gate 160 has a gate input 61 connected to the control lead 134 of the control unit 132.

In the circuit of FIG. 2, the various control circuits, such as the AC-to-DC converters 124, 144, 152, the differential amplifier 126, the integrator 128, the hold-follow circuit 130, the control unit 132, and the level detect circuit 150, all function in the same manner as described with respect to the circuit of FIG. 1. When the differential amplifier 125 detects a difference between the signals on conductors 125 and 142, an appropriate signal is sent to the control unit 132 via integrator 128 and hold/follow circuit 130, as described earlier with respect to FIG. 1. The control unit 132 responds to the input signal on its input conductor 131 to generate a positive going output signal 134 when the volume of speaker 110 is to be reduced. The positive signal on the gate input 161 of the gate 160 causes an increase in current flow through the rectifier 165, thereby shunting the current away from the speaker coil 112 and causing a reduction in speaker volume. Conversely, when the speaker volume is to be increased, the level of the signal on conductor 134 is reduced. Consequently, the magnitude of the current shunted between node 148 and ground through the gate 160 is reduced and speaker current is increased proportionally. In the circuit of FIG. 2, a fixed current limiting resistor 17 is connected between the amplifier output 110 and the node 148 to provide a minimum output impedance to the amplifier 100 when substantially all of the current between node 148 and ground is shunted through the gate 160. In operation, the volume control of the amplifier 100 is preferably initially set a maximum level. The volume control of FIG. 1 or FIG. 2 may then be used to reduce the speaker output to a level which is a selected amount above ambient noise, as detected by the microphone 120 or the coil 114. The rheostat 146 may be adjusted to a setting which provides a desired level of the music above the ambient noise. The AC-to-DC converter 144 may be provided with a "live zero" control in a well-known fashion in order to control the speaker output such that the level difference between the speaker output and the ambient noise is greater when the level of ambient noise becomes very low.

The principal difference between the circuit of FIG. 1 and the circuit of FIG. 2 is the device that is used to reduce current to the speaker coil 112. An advantage of the circuit of FIG. 1 is that in some instances the heater thermistor combinations may be less expensive than the rectifier/semiconductor gate configuration of the circuit of FIG. 2. The reaction time of the shunting configuration of FIG. 2 is somewhat faster than that of FIG. 1. However, in most cases such reaction time may not be important depending on the application in which it is used. In the current control configuration of FIG. 1, the thermistors are heated under control of the control unit 132 to control current flow to the speaker coil 112. As a practical matter, the heaters are continually activated to some extent. The thermistors tend to dissipate heat at a rapid rate, even without heat sinks. Heat sinks may be provided to enhance heat dissipation. In operation, a reduction in heating current to the heaters 136, 137 results in a relatively rapid change in temperature and in resistance in the thermistors 138, 139.

It should be understood that the above-described arrangements are merely illustrative of the application of the principles of the invention and that other arrangements may be devised by those skilled in the art without departing from the scope of the invention as defined by the appended claims.

What we claim is:

1. A volume control for use in an audio system including, in combination an amplifier providing an output signal at a predetermined level of amplification and a loudspeaker, the loudspeaker connected to the amplifier and responsive to electrical current to provide audible output volume, the volume control comprising:

- an ambient sound detector generating a detector output signal representative of a level of ambient sound in an area adjacent the detector;
- control circuitry generating a volume control signal and comprising comparator circuit connected to the ambient sound detector and operative to compare the detector output signal with a signal generated by the amplifier and applied to the loudspeaker to generate a comparator output signal to selectively vary the volume control signal;
- the loudspeaker composing an output device generating audible output volume proportional to electrical current supplied to the output device; and
- a variable current throughput device connected in parallel with the output device and responsive to the volume control signal to selectively shunt current from the output device thereby reducing current flow to the output device and varying audible output volume of the loudspeaker, the variable current throughput device comprising a thermistor and a heater unit responsive to the volume control signal to vary the temperature of the thermistor to thereby the vary the magnitude of current in the thermistor and in the output device.

2. The volume control device in accordance with claim 1 wherein the output device comprises a speaker coil.

3. The volume control in accordance with claim 1 wherein the thermistor is a positive thermistor providing a resistance value which increases when heat is applied to the positive thermistor, and further comprising a negative thermistor connected between the amplifier and the speaker and providing a resistance value which decreases when heat is applied to the negative thermistor and heat application devices disposed adjacent the positive and negative thermistors responsive to the volume control signal to selectively apply heat to the positive and negative thermistors.

4. The volume control in accordance with claim 1 wherein the loudspeaker comprises an output device generating output volume proportional to electrical power applied to the loudspeaker and wherein the variable current throughput device is connected in series in a current path between the amplifier and the loudspeaker.

5. A volume control for use in an audio system including, in combination, an amplifier providing an output signal at a predetermined level of amplification and a loudspeaker, the loudspeaker connected to the amplifier and responsive to electrical current to provide audible output volume, the volume control comprising:

- an ambient sound detector generating a detector output signal representative of a level of ambient sound in an area adjacent the detector;
- control circuitry connected to the ambient sound detector and generating a volume control signal;
- a variable current throughput device connected to the amplifier and the loudspeaker and responsive to the volume control signal to selectively control electrical power transfer from the amplifier to the loudspeaker, thereby controlling audible output volume of the loudspeaker;
- the loudspeaker comprising a loudspeaker driver coil responsive to electrical current to produce audible sound from the loudspeaker and the ambient sound detector comprising a detector coil disposed adjacent the loudspeaker driver coil, the detector coil responsive to sound reflected to the loudspeaker from an area adjacent the loudspeaker to generate the detector output signal.

6. The volume control in accordance with claim 5 and wherein the variable current throughput device comprises a semiconductor gate circuit connected in parallel with the loud speaker and having a control input connected to the control circuitry and responsive to the volume control signal to selectively control current flow through the loud speaker, thereby controlling audible output volume of the loudspeaker.

7. The volume control in accordance with claim 6 wherein the gate circuit comprises a field effect transistor and the circuit further comprises a rectifier circuit connected between the output device and the field effect transistor.

8. The volume control in accordance with claim 7 and further comprising a resistor connected between the signal source and the output device.

9. The volume control in accordance with claim 5 wherein the loudspeaker comprises a speaker core and wherein the loudspeaker driver coil is wound around the speaker core and the detector coil is wound around the speaker core in phase with the speaker coil.

10. The volume control in accordance with claim 9 wherein the speaker coil and the detector coil each have one end connected to a common node connected to the amplifier.

11. A volume control for use in an audio system including, in combination, an amplifier providing an output signal at a predetermined level of amplification and a loudspeaker connected to the amplifier and responsive to electrical current to provide audible output volume, the volume control comprising:

- an ambient sound detector generating a detector output signal representative of a level of ambient sound in an area adjacent the detector;
- control circuitry connected to the ambient sound detector and generating a volume control signal;
- a volume control device connected to the amplifier and the loudspeaker and responsive to the volume control signal to selectively control electrical power transfer from the amplifier to the loudspeaker, thereby controlling audible output volume of the loudspeaker;
- the loudspeaker comprising a loudspeaker core and a loudspeaker driver coil wound around the loudspeaker core, the loudspeaker driver coil responsive to electrical current to produce audible sound from the loudspeaker;
- the ambient sound detector comprising a detector coil wound around the loudspeaker core in phase with the loudspeaker driver coil.

12. The volume control in accordance with claim 11 and wherein the control circuitry comprises a comparator circuit connected to the ambient sound detector and operative to compare the detector output signal with the output signal generated by the amplifier and applied to the loudspeaker to generate a comparator output signal to selectively vary the volume control signal.

13. The volume control in accordance with claim 12 wherein the control circuitry comprises an integrator circuit responsive to the comparator output signal to generate an integrator output signal representative of the comparator output signal over a period of time, and wherein the control circuitry selectively varies the volume control signal in accordance with the integrator output signal.

14. The volume control in accordance with claim 12 wherein the control circuitry further comprises:

a level detect circuit operative to compare a signal generated by the amplifier with a predefined signal level and wherein the control circuitry varies the volume control signal in accordance with the comparator circuit output when the signal generated by the amplifier varies from the predefined signal level in one direction and maintains an existing level of volume control signal when the signal generated by the amplifier varies from the predefined signal level in another direction.

* * * * *

UNITED STATES PATENT AND TRADEMARK OFFICE
CERTIFICATE OF CORRECTION

PATENT NO. : 5,793,874
DATED : Aug. 11, 1998
INVENTOR(S) : ARTHUR J. CAMIRE

It is certified that error appears in the above-indentified patent and that said Letters Patent is hereby corrected as shown below:

Col. 7, line 8:
        between comprising and comparator insert "a"

Col. 7, line 14:
        delete "composing" and substitute therefor --comprising--

Signed and Sealed this

Twenty-second Day of June, 1999

Attest:

Q. TODD DICKINSON

Attesting Officer     Acting Commissioner of Patents and Trademarks